(12) United States Patent
Lipka et al.

(10) Patent No.: US 11,125,579 B2
(45) Date of Patent: Sep. 21, 2021

(54) CALIBRATION SYSTEM, AND SENSOR SYSTEM INCLUDING THE SAME

(71) Applicant: Panasonic Intellectual Property Management Co., Ltd., Osaka (JP)

(72) Inventors: Ronald Joseph Lipka, Northborough, MA (US); Diego Emilio Serrano, Peachtree City, GA (US)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 87 days.

(21) Appl. No.: 16/369,685

(22) Filed: Mar. 29, 2019

(65) Prior Publication Data

US 2020/0309563 A1    Oct. 1, 2020

(51) Int. Cl.
*G01C 25/00* (2006.01)
*H03F 3/45* (2006.01)
*G01C 19/5712* (2012.01)

(52) U.S. Cl.
CPC ......... *G01C 25/00* (2013.01); *G01C 19/5712* (2013.01); *H03F 3/45475* (2013.01); *H03F 2200/129* (2013.01); *H03F 2203/45116* (2013.01)

(58) Field of Classification Search
CPC . G01C 25/00; G01C 19/5712; H03F 3/45475; H03F 2200/129; H03F 2203/45116
See application file for complete search history.

(56) References Cited

U.S. PATENT DOCUMENTS

| 6,308,554 B1 | 10/2001 | Mattes et al. |
| 8,166,816 B2 | 5/2012 | Ayazi et al. |
| 2013/0269413 A1* | 10/2013 | Tao .......................... B81B 7/008 73/1.38 |
| 2015/0160632 A1* | 6/2015 | Buhmann .......... G01C 19/5776 700/275 |
| 2018/0287559 A1* | 10/2018 | Zhu .......................... H03F 3/19 |

* cited by examiner

*Primary Examiner* — Herbert K Roberts
*Assistant Examiner* — John M Royston
(74) *Attorney, Agent, or Firm* — Westerman, Hattori, Daniels & Adrian, LLP

(57) ABSTRACT

An aspect of the present disclosure concerns a calibration system including a test tone signal generator that produces a test tone; a transimpedance amplifier (TIA) that comprises two input terminals, receives two output signals from an external sensor device, the test tone, and a calibration signal at the two input terminals, and produces a voltage signal; and a calibration circuit that receives the voltage signal and the test tone to produce the calibration signal that causes the TIA to produce the voltage signal such that an error signal included in the voltage signal is canceled. The external sensor device may be a mode-matched vibratory microelectro-mechanical systems (MEMS) gyroscope.

8 Claims, 4 Drawing Sheets

CALIBRATION SYSTEM, AND SENSOR SYSTEM INCLUDING THE SAME

TECHNICAL FIELD

Aspects of the present disclosure relate to calibration system, and a sensor system including the same.

BACKGROUND ART

As an example of a sensor system, there is a gyroscope system including, e.g., a mode-matched vibratory micro-electro-mechanical systems (MEMS) gyroscope. Such sensor system can be utilized, e.g., for navigation in the fields such as aircraft and vehicles.

U.S. Pat. No. 8,166,816, which is incorporated by reference herein in its entirety pursuant to 37 C.F.R. 1.57(c), (d) and (e), discloses an example of a conventional bulk acoustic wave gyroscope that includes at least one drive electrode coupled to a bulk acoustic resonator and positioned to excite vibration of the bulk acoustic resonator in a first bulk acoustic wave mode, and two sense electrode coupled to the bulk acoustic resonator and positioned to detect vibration of the bulk acoustic resonator in a second bulk acoustic wave mode, where the first and second bulk acoustic wave modes are degenerate. Plural electrodes including the at least one drive electrode and the two sense electrodes surround and are separated from the bulk acoustic resonator, generally having a disk shape, with predetermined capacitive gaps. When the MEMS gyroscope detects vibration of the bulk acoustic resonator, the MEMS gyroscope outputs two current signals from the respective two sense electrodes where the current signals correspond to the vibration indicating an angular velocity of the MEMS gyroscope. A later-stage amplifier (for example, transimpedance amplifier (TIA)) receives the two current signals and outputs a voltage signal corresponding to the difference between the two current signals and indicating the angular velocity.

SUMMARY

In an ideal MEMS gyroscope, the two current signals from the respective two sense electrodes should take the same value when the MEMS gyroscope does not detect an angular velocity. However, where the gap between the bulk acoustic resonator and each sense electrode is not uniform or there is asymmetry in the characteristics of the sense electrodes, for example, attributable to a manufacturing process or distortion of the bulk acoustic resonator in operation, the amplitudes of the two current signals could mismatch from each other, and such mismatch could cause the later-stage amplifier to output a non-zero voltage signal (offset signal) even when the MEMS gyroscope does not detect an angular velocity.

In light of the above circumstance, an aspect of the present disclosure concerns a calibration system comprising a test tone signal generator that produces a test tone; a transimpedance amplifier (TIA) that comprises two input terminals, receives two output signals from an external sensor device, the test tone, and a calibration signal at the two input terminals, and produces a voltage signal; and a calibration circuit that receives the voltage signal and the test tone to produce the calibration signal that causes the TIA to produce the voltage signal such that an error signal included in the voltage signal is canceled. The external sensor device may be a mode-matched vibratory micro-electro-mechanical systems (MEMS) gyroscope.

DESCRIPTION OF EMBODIMENTS

Figure 1:
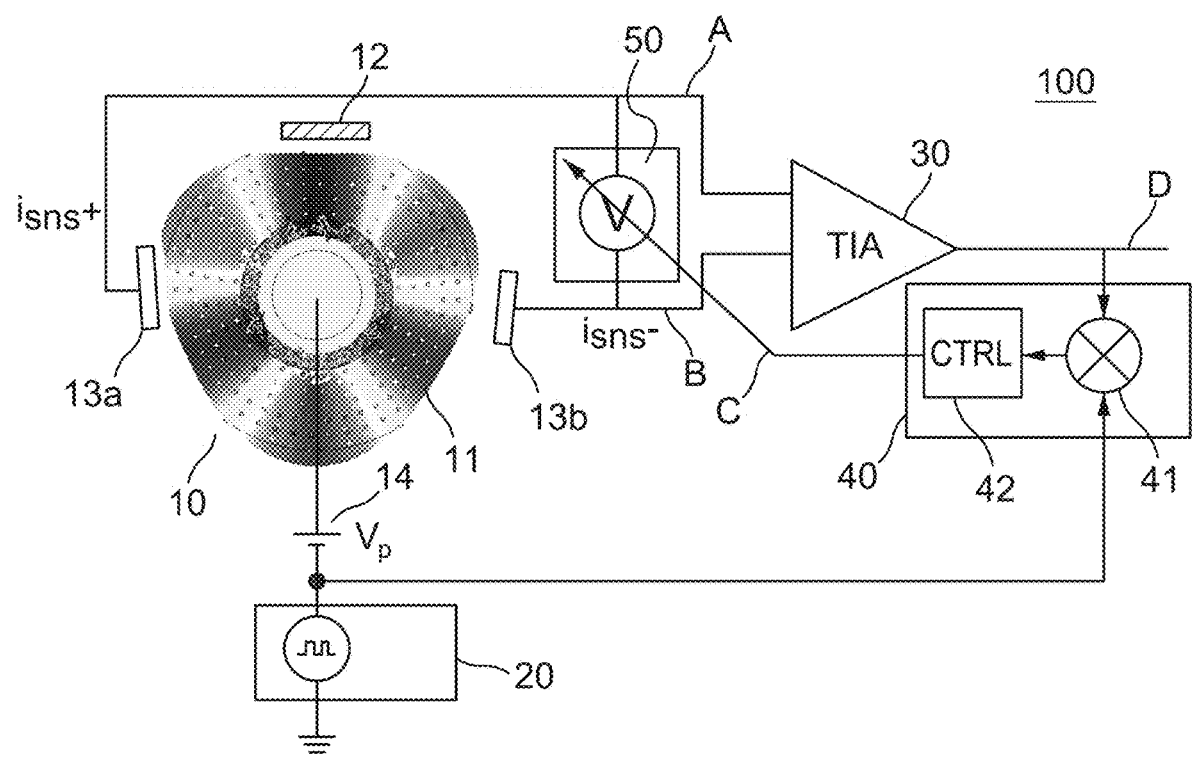
FIG. 1 shows an exemplary embodiment of a gyroscope system.

FIG. 1 shows an exemplary embodiment of a gyroscope system 100. The gyroscope system 100 includes a MEMS gyroscope 10, a test tone signal generator 20, a transimpedance amplifier (TIA) 30, a calibration circuit 40, and a voltage-current converter 50.

The MEMS gyroscope 10 is a mode-matched vibratory gyroscope in this embodiment, and includes a bulk acoustic resonator 11 that is in a disk shape, one or more drive electrodes 12, two sense electrodes 13a, 13b, and a voltage source 14. The one or more drive electrodes 12 are coupled to the bulk acoustic resonator 11 and positioned to excite vibration of the bulk acoustic resonator 11 in a first bulk acoustic wave mode. The two sense electrodes 13a, 13b are coupled to the bulk acoustic resonator and positioned to detect vibration of the bulk acoustic resonator 11 in a second bulk acoustic wave mode. The first and second bulk acoustic wave modes are degenerate. In an operational state of the gyroscope system 100, the voltage source 14 applies a constant voltage (polarization voltage) $V_p$ to the bulk acoustic resonator 11 to reduce the motional resistance of, and allow for electrostatic tuning of the bulk acoustic resonator 11. The detected vibration corresponds to an angular velocity of the MEMS gyroscope, and is output from the two sense electrodes 13a, 13b as $i_{sns+}$ and $i_{sns-}$.

The test tone signal generator 20 produces a test tone. The test tone is a periodic rectangular wave having a frequency different from an oscillation frequency of the MEMS gyroscope 10 in this exemplary embodiment. For example, the oscillation frequency may be 5 MHz, and a test tone frequency may be in a range of 250 Hz to 2.5 KHz. The test tone may take another wave form that is periodic in nature. The test tone as well as the polarization voltage $V_p$ are configured to be applied to the bulk acoustic resonator 11 in this exemplary embodiment.

The TIA 30, a current to voltage converter, receives $i_{sns+}$ and $i_{sns-}$ through two input terminals, and outputs a voltage signal that corresponds to difference between $i_{sns+}$ and $i_{sns-}$.

The calibration circuit 40 receives the voltage signal and the test tone, and produce a calibration signal. In this exemplary embodiment, the calibration circuit 40 consists of a demodulator 41 and a calibration controller 42. The demodulator 41 demodulates the voltage signal with the test tone, and produces a demodulated signal. The demodulator 41 may be a multiplier. The calibration controller 42 receives the demodulated signal, determines a calibration signal based on the demodulated signal and outputs the calibration signal. The calibration controller 42 may be a PID controller (proportional-integral-derivative controller)

that is used to control the feedback loop stability and settling time by adjusting the amounts of proportional, integral, and derivative path gains.

The voltage-current converter 50 may consist of two variable resistors and a transconductor amplifier ("gm" stage), and used to apply the test tone to the two sense electrodes 13a, 13b in the form of a current as will be explained in a later embodiment.

In this exemplary embodiment, the test tone is applied between the two input terminals of the TIA 30 via the bulk acoustic resonator 11, the gap between the bulk acoustic resonator 11 and each sense electrode, and the two sense electrodes 13a, 13b. The calibration signal is also applied between the two input terminals of the TIA 30 directly as shown in FIG. 1. This means that the calibration controller 42 feeds back the voltage signal to the TIA 30. In other words, the TIA 30 and the calibration circuit 40 form a feedback loop with respect to the voltage signal.

Figure 2:
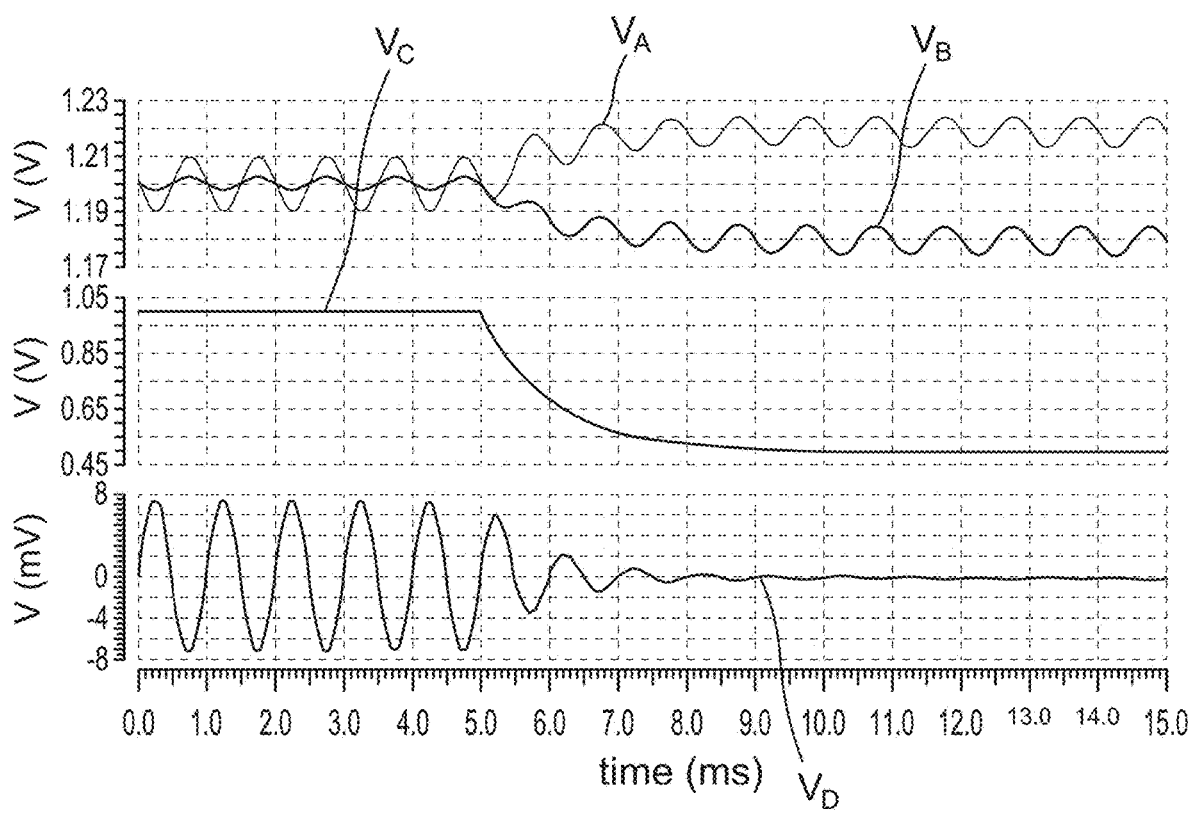
FIG. 2 illustrates graphs showing relationship between voltage amplitude and time, associated with the operation of the gyroscope system 100 where t and v(t) respectively denote time and voltage amplitude at certain points shown in FIG. 1.

FIG. 2 illustrates graphs showing relationship between voltage amplitude and time, associated with the operation of the gyroscope system 100 where t and v(t) respectively denote time and voltage amplitude at certain points in the gyroscope system 100. The certain points are shown in FIG. 1.

As shown in FIG. 2, before the calibration signal having an amplitude $V_C$ is applied to the two input terminals of the TIA 30 via the feedback loop (at point C) (before t=5.0 msec.), the voltage amplitudes at points A and B, $V_A$ and $V_B$, do not match each other when the MEMS gyroscope 10 detects no angular velocity in the operational state. This situation reflects existence of an error signal due to the non-uniform gaps and/or asymmetry regarding the two sense electrodes. After the calibration signal starts to be applied at t=5.0 msec., $V_A$ and $V_B$ are changed so that the $V_A$ and $V_B$ match each other and the error signal added onto the voltage signal output from the TIA 30 decreases over time. As a result, an amplitude $V_D$ of the voltage signal output from the TIA 30 (at point D) is smoothed out at around t=8.0 msec. or later as shown in FIG. 2.

Figure 3:
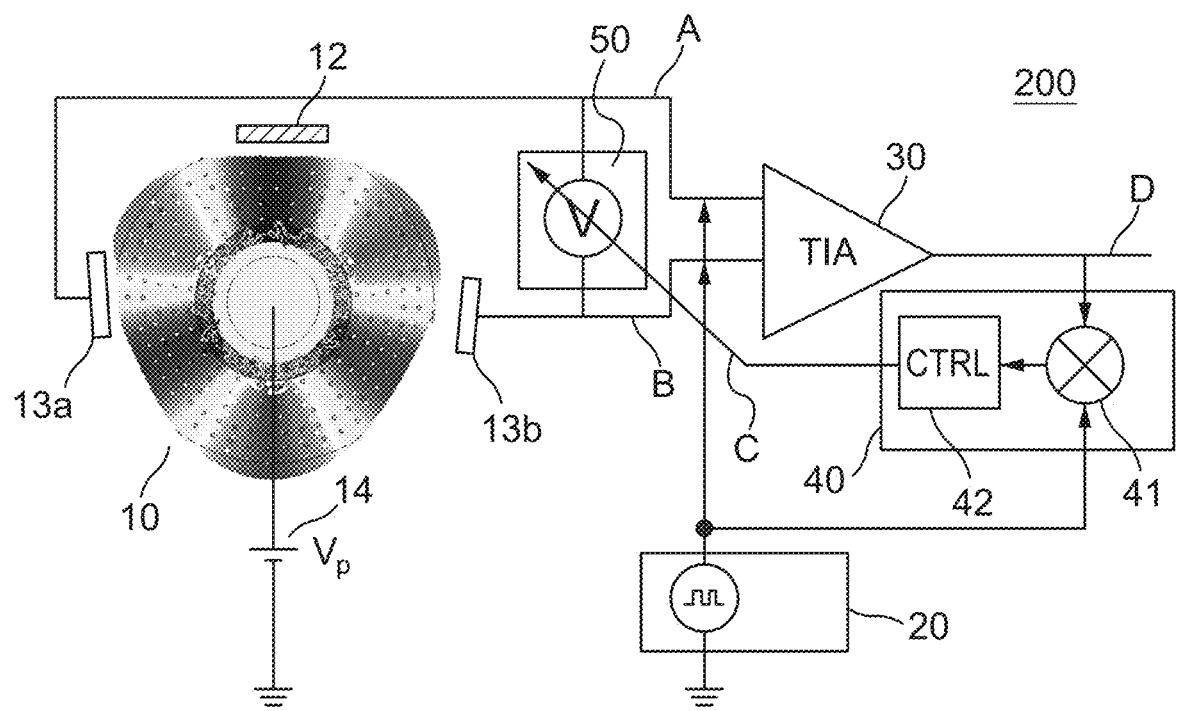
FIG. 3 shows another exemplary embodiment of a gyroscope system.

FIG. 3 shows an exemplary embodiment of a gyroscope system 200. The gyroscope system 200 includes the same electrical elements as in the gyroscope system 100. The difference from the gyroscope system 100 is that, in gyroscope system 200, the test tone is configured to be directly applied to the two input terminals of the TIA 30, instead of being indirectly applied via the bulk acoustic resonator 11, the gap between the bulk acoustic resonator 11 and each sense electrode, and the two sense electrodes 13a, 13b as in the gyroscope system 100.

Figure 4:
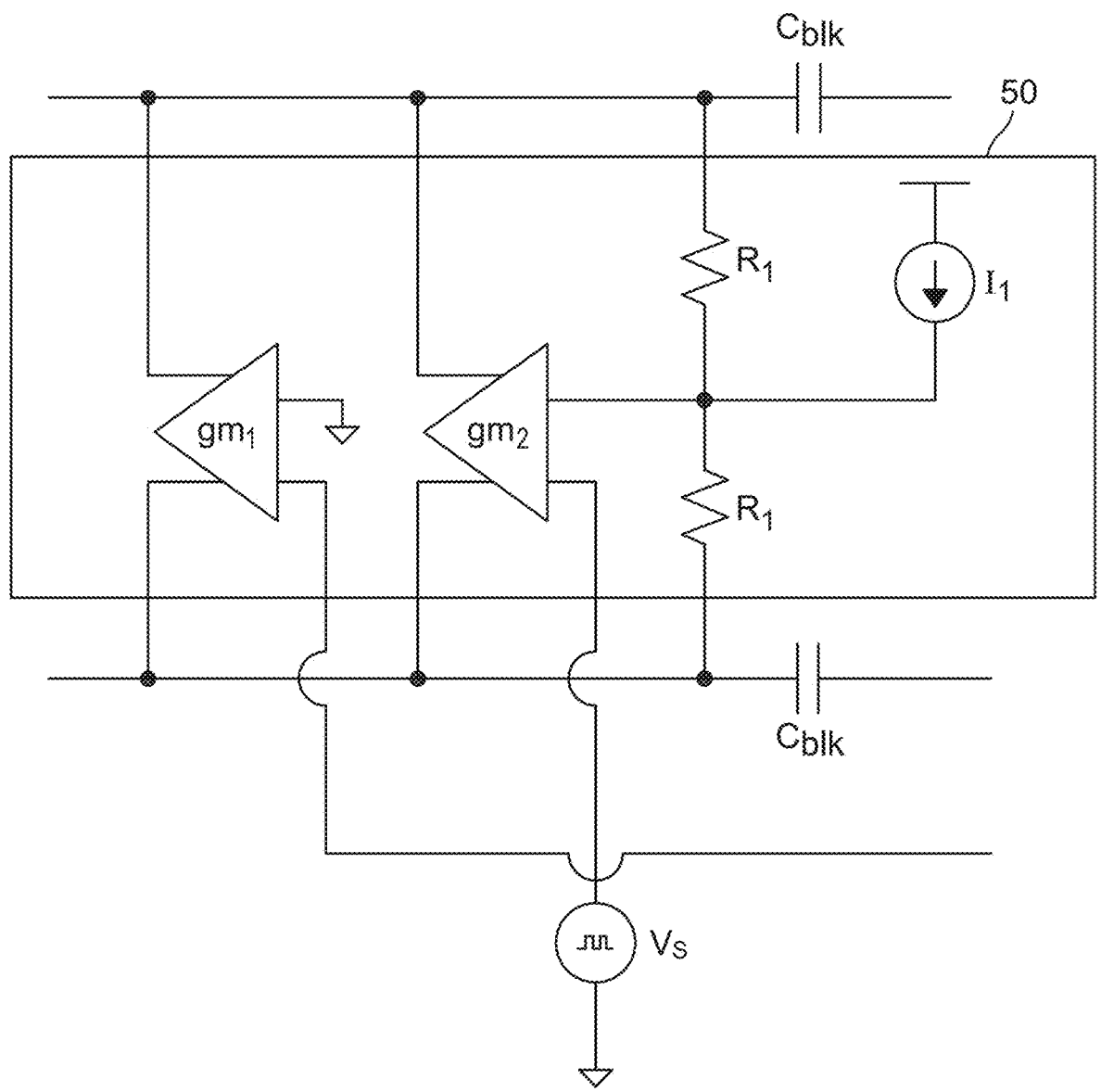
FIG. 4 shows an exemplary implementation of a voltage-current converter 50.

FIG. 4 shows an exemplary implementation of the voltage-current converter 50 that may consist of two resistors R1 of the same value, two transconductor amplifiers ("gm$_1$" and "gm$_2$" stages), and a DC current source $I_1$. Each $C_{blk}$ in FIG. 4 denotes DC blocking cap. In this exemplary implementation, the transconductor amplifier "gm$_2$" receives the test tone and modulates the common mode voltages of the two sense electrodes 13a and 13b via the feedback loop formed by the "gm$_2$" and the resistors $R_1$. The resistors $R_1$ are used to sense the common mode voltage of the two sense electrodes, and the "gm$_2$" outputs a common mode current to adjust the common voltage until it matches the test tone voltage.

The differential DC voltage between the two sense electrodes is controlled by the calibration signal, the "gm$_1$" stage, the resistors $R_1$, and the DC current source $I_1$. The calibration signal is compared to ground at the "gm$_1$" stage input. The "gm$_1$" stage produces a constant common mode current of $0.5*I_1$, and a differential output current relative to the difference between the calibration signal and ground, which flows through resistors $R_1$ to create a differential voltage at the two sense electrodes.

A mechanism of the gyroscope system 200 offsetting an error signal due to the non-uniform gaps and/or asymmetry regarding the two sense electrodes 13a, 13b is substantially the same as that of the gyroscope system 100.

It is noted that the calibration scheme described above is applicable to various electronic systems where one or more output signals output from an external sensor (including but not limited to a MEMS gyroscope) device may include an error signal(s).

While various aspects of gyroscope systems relating to the present disclosure have been particularly shown and described with reference to the exemplary embodiments, it is understood by those having ordinary skill in the art that various changes in form and details may be made therein without departing from the spirit and scope of the present invention as defined by the following claims and their equivalents. It should therefore be understood that the exemplary embodiments be considered in all respects as illustrative and not restrictive, and that reference be made to the claims rather than the foregoing description to determine the scope of the present invention.

EXPLANATION OF REFERENCE SYMBOLS

01. 100 gyroscope system
02. 10 MEMS gyroscope
03. 11 bulk acoustic resonator
04. 12 one or more drive electrodes,
05. 13a, 13b sense electrodes
06. 14 voltage source
07. 20 test tone signal generator
08. 30 TIA
09. 40 calibration circuit
10. 41 demodulator
11. 42 calibration controller
12. 50 voltage-current converter
13. 200 gyroscope system

The invention claimed is:

1. A sensor system comprising:
a mode-matched vibratory micro-electro-mechanical systems (MEMS) gyroscope that comprises a bulk acoustic resonator, at least one drive electrode that is coupled to the bulk acoustic resonator and positioned to excite vibration of the bulk acoustic resonator in a first bulk acoustic wave mode, and two sense electrodes that are capacitively coupled to the bulk acoustic resonator and positioned to detect vibration of the bulk acoustic resonator in a second bulk acoustic wave mode wherein the detected vibration corresponds to an angular velocity of the MEMS gyroscope, the two sense electrodes being located away from the bulk acoustic resonator with gaps each provided between the bulk acoustic resonator and respective one of the two sense electrodes;
a test tone signal generator that produces a test tone;
a transimpedance amplifier (TIA) that comprises two input terminals, the TIA receiving currents from the two sense electrodes, the test tone, and a calibration signal at the two input terminals, and producing a voltage signal such that the voltage signal includes an error signal produced due to non-uniformity between the gaps and/or due to asymmetry between the two sense electrodes; and a calibration circuit that receives the voltage signal and the test tone to produce the calibration signal that causes the TIA to produce the voltage signal such that the error signal included in the voltage signal is canceled.

2. The sensor system according to claim 1, wherein the calibration circuit comprises a demodulator that demodulates the voltage signal with the test tone to produce a demodulated signal, and a calibration controller that receives the demodulated signal to produce a calibration signal.

3. The sensor system according to claim 1, wherein the test tone is a periodic wave having a predetermined period.

4. The sensor system according to claim 3, wherein the test tone is a rectangular wave or sinusoidal wave.

5. The sensor system according to claim 1, further comprising a voltage source, wherein the test tone signal generator is configured such that the test tone is applied to the two input terminals of the TIA via the bulk acoustic resonator, the gaps, and the two sense electrodes.

6. The sensor system according to claim 1, wherein the test tone signal generator is configured such that the test tone is applied to the two input terminals of the TIA directly.

7. The sensor system according to claim 2, wherein the demodulator is a multiplier.

8. A calibration system comprising:
a test tone signal generator that produces a test tone;
a transimpedance amplifier (TIA) that comprises two input terminals, the TIA receiving two output signals from an external sensor device, the test tone, and a calibration signal at the two input terminals, and producing a voltage signal; and
a calibration circuit that receives the voltage signal and the test tone to produce the calibration signal that causes the TIA to produce the voltage signal, wherein
the external sensor device includes a bulk acoustic resonator and two sense electrodes that are capacitively coupled to the bulk acoustic resonator and positioned to detect vibration of the bulk acoustic resonator, and the detected vibration corresponds to an angular velocity of the external sensor device, the two sense electrodes being located away from the bulk acoustic resonator with gaps each provided between the bulk acoustic resonator and respective one of the two sense electrodes,
the voltage signal includes an error signal produced due to non-uniformity between the gaps and/or due to asymmetry between the two sense electrodes, and
the calibration circuit is configured to produce the calibration signal that causes the TIA to produce the voltage signal such that the error signal included in the voltage signal is canceled.

* * * * *